United States Patent
Choi et al.

(10) Patent No.: US 11,961,574 B2
(45) Date of Patent: Apr. 16, 2024

(54) MEMORY DEVICE AND METHOD OF OPERATING THE SAME

(71) Applicant: SK hynix Inc., Icheon-si Gyeonggi-do (KR)

(72) Inventors: June Young Choi, Icheon-si Gyeonggi-do (KR); Un Sang Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 181 days.

(21) Appl. No.: 17/575,393

(22) Filed: Jan. 13, 2022

(65) Prior Publication Data

US 2023/0046005 A1  Feb. 16, 2023

(30) Foreign Application Priority Data

Aug. 11, 2021  (KR) .................. 10-2021-0106153

(51) Int. Cl.
| | |
|---|---|
| *G11C 11/34* | (2006.01) |
| *G11C 16/04* | (2006.01) |
| *G11C 16/08* | (2006.01) |
| *G11C 16/10* | (2006.01) |
| *G11C 16/34* | (2006.01) |

(52) U.S. Cl.
CPC ...... *G11C 16/3459* (2013.01); *G11C 16/0483* (2013.01); *G11C 16/08* (2013.01); *G11C 16/10* (2013.01)

(58) Field of Classification Search
CPC . G11C 16/3459; G11C 16/0483; G11C 16/08; G11C 16/10
USPC .................................................. 365/185.22
See application file for complete search history.

(56) References Cited

U.S. PATENT DOCUMENTS

| | | | | |
|---|---|---|---|---|
| 6,462,990 B1 * | 10/2002 | Keeney | ............... | G11C 16/3409 |
| | | | | 365/185.29 |
| 10,453,542 B2 * | 10/2019 | Kim | .................. | G11C 16/0483 |
| 10,586,603 B2 * | 3/2020 | Park | .................. | G11C 16/0483 |

FOREIGN PATENT DOCUMENTS

| | | |
|---|---|---|
| KR | 101211840 B1 | 12/2012 |
| KR | 1020190057517 A | 5/2019 |

* cited by examiner

*Primary Examiner* — Viet Q Nguyen
(74) *Attorney, Agent, or Firm* — William Park & Associates Ltd.

(57) ABSTRACT

A memory device includes a memory block including memory cells to which a program voltage is applied through a word line. The memory device also includes a peripheral circuit configured to perform a verify operation of comparing threshold voltages of the memory cells with a verify voltage on each of a plurality of program levels. The memory device further includes a control logic circuit configured to control the peripheral circuit to apply a plurality of blind voltages related to a target level among the plurality of program levels to the word line, and determine a start time point of a verify operation corresponding to a next program level of the target level using the number of fail bits for each of the plurality of blind voltages.

20 Claims, 14 Drawing Sheets

FIG. 4
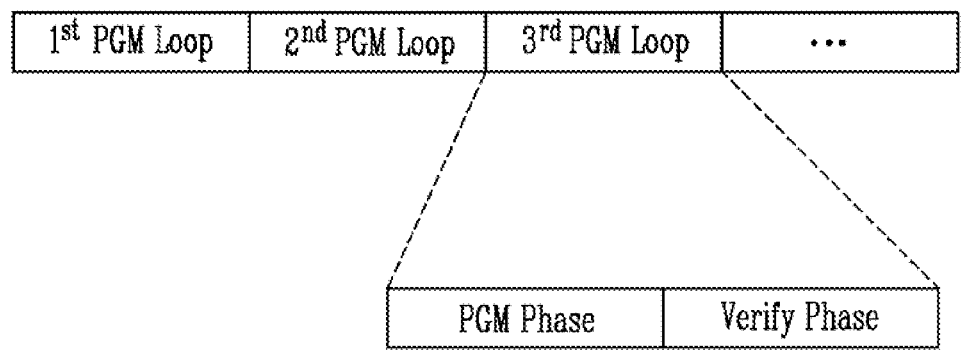
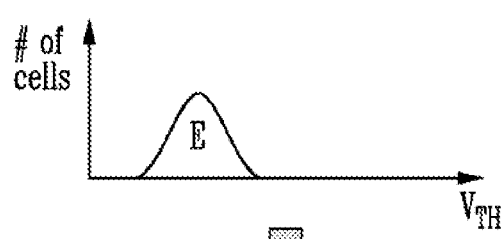
FIG. 5A
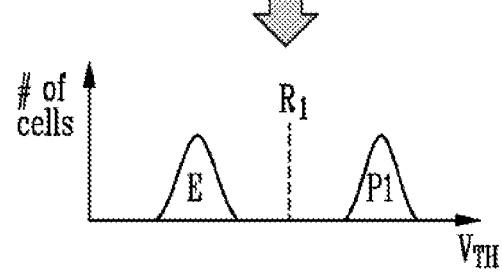
FIG. 5B

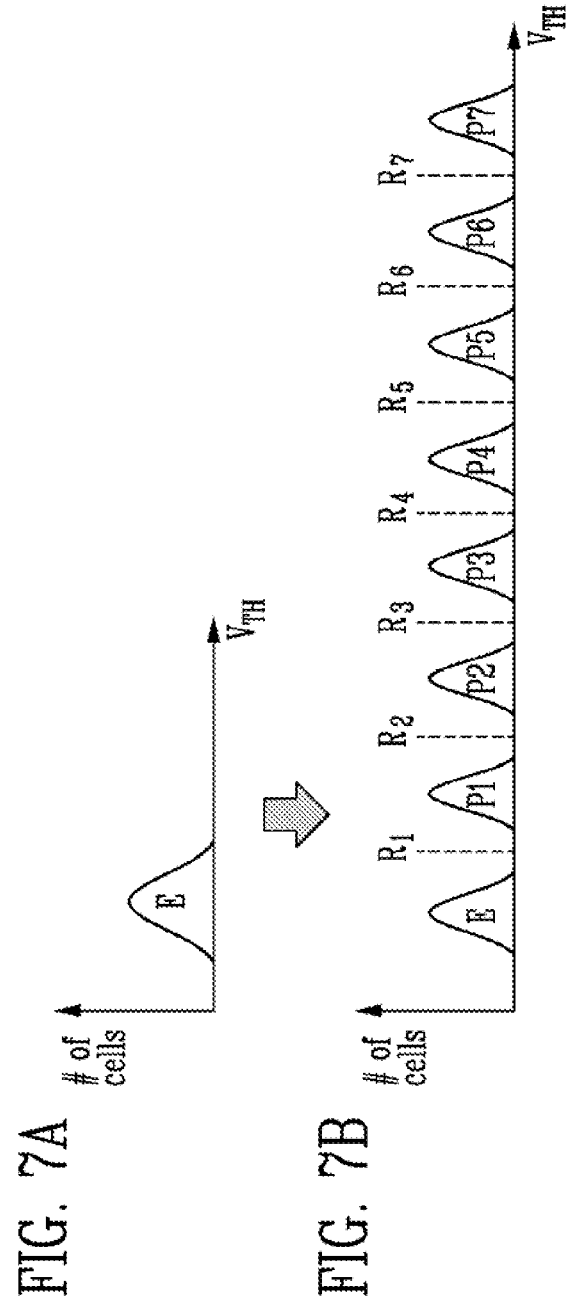

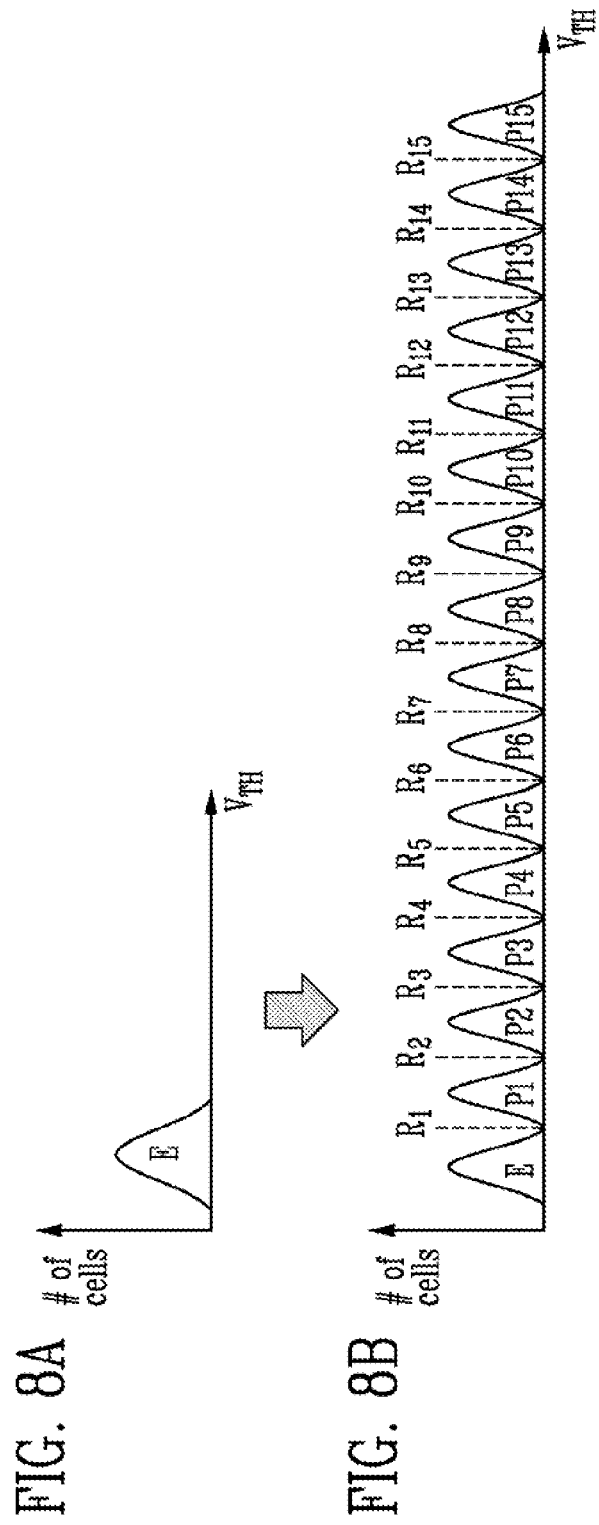

MEMORY DEVICE AND METHOD OF OPERATING THE SAME

CROSS-REFERENCE TO RELATED APPLICATION

The present application claims priority under 35 U.S.C. § 119(a) to Korean patent application number 10-2021-0106153 filed on Aug. 11, 2021, in the Korean Intellectual Property Office, the entire disclosure of which is incorporated by reference herein.

BACKGROUND

1. Technical Field

The present disclosure relates to an electronic device, and more particularly, to a memory device and a method of operating the same.

2. Related Art

A storage device is a device that stores data under the control of a host device such as a computer or a smartphone. A storage device may include a memory device for storing data and a memory controller for controlling the memory device. A memory device may be classified as a volatile memory device or a nonvolatile memory device.

A volatile memory device is a device that stores data only while power is supplied and loses the stored data when the power supply is cut off. A volatile memory device may include static random access memory (SRAM), dynamic random access memory (DRAM), and the like.

A nonvolatile memory device is a device that does not lose data even though power is cut off. A nonvolatile memory device may include read only memory (ROM), programmable ROM (PROM), electrically programmable ROM (EPROM), electrically erasable and programmable ROM (EEPROM), flash memory, and the like.

SUMMARY

According to an embodiment of the present disclosure, a memory device may include a memory block including memory cells to which a program voltage is applied through a word line. The memory device may also include a peripheral circuit configured to perform a verify operation of comparing threshold voltages of the memory cells with a verify voltage on each of a plurality of program levels. The memory device may further include a control logic circuit configured to control the peripheral circuit to apply a plurality of blind voltages related to a target level among the plurality of program levels to the word line, and determine a start time point of a verify operation corresponding to a next program level of the target level using the number of fail bits for each of the plurality of blind voltages.

According to an embodiment of the present disclosure, a memory device may include a memory block including memory cells to which a program voltage is applied through a word line. The memory device may also include a peripheral circuit configured to perform a verify operation of comparing threshold voltages of the memory cells with a verify voltage on each of a plurality of program levels. The memory device may further include a control logic circuit configured to control the peripheral circuit to apply a plurality of blind voltages related to a first level among the plurality of program levels to the word line in a voltage magnitude order, and determine a start time point of a verify operation corresponding to a second level that is a next program level of the first level using the number of fail bits for each of the plurality of blind voltages.

According to an embodiment of the present disclosure, a method of operating a memory device may include applying a program voltage to memory cells through a word line, and performing a verify operation of comparing threshold voltages of the memory cells with a verify voltage on each of a plurality of program levels. Performing the verify operation may include applying a plurality of blind voltages related to a target level among the plurality of program levels to the word line, and determining a start time point of a verify operation corresponding to a next program level of the target level using the number of fail bits for each of the plurality of blind voltages.

According to an embodiment of the present disclosure, a method of operating a memory device may include applying a program voltage to memory cells through a word line, and performing a verify operation of comparing threshold voltages of the memory cells with a verify voltage on each of a plurality of program levels. Performing the verify operation may include applying a plurality of blind voltages related to a first level among the plurality of program levels to the word line in a voltage magnitude order, and determining a start time point of a verify operation corresponding to a second level that is a next program level of the first level using the number of fail bits for each of the plurality of blind voltages.

BRIEF DESCRIPTION OF THE DRAWINGS

FIG. 4 is a diagram illustrating a plurality of program loops included in a program operation, and a program voltage apply operation and a verify operation included in each program loop.

FIGS. 5A and 5B are diagrams illustrating a threshold voltage distribution of a single-level cell.

FIGS. 7A and 7B are diagrams illustrating a threshold voltage distribution of a triple-level cell.

FIGS. 8A and 8B are diagrams illustrating a threshold voltage distribution of a quad-level cell.

DETAILED DESCRIPTION

Specific structural or functional descriptions of presented embodiments are disclosed according to the concept of the present disclosure. These embodiments, however, are not exhaustive and should not be construed as limiting the present specification or application. Additional embodiments in accordance with the teaching of the present disclosure as set forth by attached claims are possible.

Figure 1:
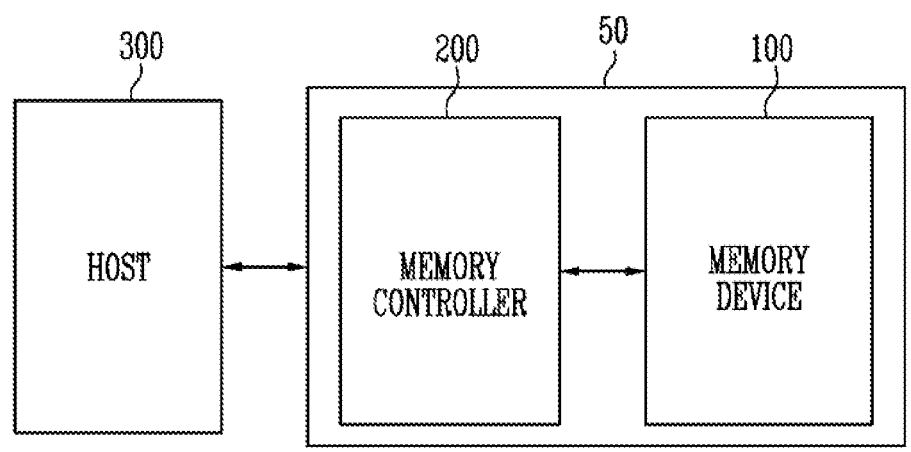
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, the memory system 50 may include a memory device 100 and a memory controller 200 that controls the operation of the memory device. The memory system 50 may be a device that stores data under control of a host 300 such as a cellular phone, a smartphone, an MP3 player, a laptop computer, a desktop computer, a game player, a TV, a tablet PC, or an in-vehicle infotainment system.

The memory system 50 may be manufactured as one of various types of memory systems according to a host interface that determines a communication method with the host 300. For example, the memory system 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The memory system 50 may be manufactured as any one of various types of packages. For example, the memory system 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array (not shown) including a plurality of memory cells that store data.

Each of the memory cells may be configured as a single-level cell (SLC) that stores one data bit, a multi-level cell (MLC) that stores two data bits, a triple-level cell (TLC) that stores three data bits, or a quad-level cell (QLC) capable of storing four data bits The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may use double data rate synchronous dynamic random access memory (DDR SDRAM), low power double data rate4 (LPDDR4) SDRAM, graphics double data rate (GDDR) SDRAM, low power DDR (LPDDR), Rambus dynamic random access memory (RDRAM), NAND flash memory, vertical NAND flash memory, NOR flash memory, resistive random access memory (RRAM), phase-change random access memory (PRAM), magnetoresistive random access memory (MRAM), ferroelectric random access memory (FRAM), spin transfer torque random access memory (STT-RAM), or the like. In the present specification, for convenience of description, it is assumed that the memory device 100 uses NAND flash memory.

The memory device 100 may be configured to receive a command CMD and an address ADDR from the memory controller 200 and access an area selected by the address ADDR in the memory cell array. The memory device 100 may perform an operation instructed by the command CMD on the area selected by the address ADDR. For example, the memory device 100 may perform a program operation, a read operation, or an erase operation. During the program operation, the memory device 100 may store data in the area selected by the address ADDR. During the read operation, the memory device 100 may read data from the area selected by the address ADDR. During the erase operation, the memory device 100 may erase data stored in the area selected by the address ADDR.

The memory device 100 may include a plurality of planes. The plane may be a unit capable of independently performing an operation. For example, the memory device 100 may include two, four, or eight planes. The plurality of planes may independently perform each of the program operation, the read operation, and the erase operation, simultaneously.

In an embodiment, the memory device 100 may perform a background media scan (BGMS) operation. The BGMS operation may be performed in an idle time while a command is not being received from the memory controller 200. In addition, the BGMS operation may be performed to prevent read fail, that is, uncorrectable error correction codes (UECC) for read data during the read operation in advance.

For example, the memory device 100 may scan (read) data stored in the memory cells in the idle time. The memory device 100 may select a page on which the read operation is highly likely to fail based on a scan result and perform a refresh operation. At this time, the memory device 100 may scan data sequentially according to a memory block number or according to a random memory block number.

During the BGMS, the memory device 100 may detect a page that is potentially having UECC by scanning data stored in the page. The memory device 100 may prevent the UECC in advance by programming data of the detected page in another memory block. The memory device 100 may improve data reliability by detecting a page that is likely to potentially have UECC due to read disturb and retention.

The memory controller 200 may control an overall operation of the memory system 50.

When power is applied to the memory system 50, the memory controller 200 may execute firmware (FW). When the memory device 100 is a flash memory device, the firmware (FW) may include a host interface layer (HIL) that controls communication with the host 300, and the memory controller 200 may include a flash translation layer (FTL) that controls communication between the host 300 and the memory device 100, and a flash interface layer (FIL) that controls communication with the memory device 100.

The memory controller 200 may receive write data and a logical block address (LBA) from the host 300 and may convert the LBA into a physical block address (PBA) indicating an address of memory cells included in the memory device 100 in which data is to be stored. In the present specification, the LBA and a "logic address" or a "logical address" may be used as the same meaning. In the present specification, the PBA and a "physical address" may be used as the same meaning.

The memory controller 200 may control the memory device 100 to perform the program operation, the read operation, the erase operation, or the like according to a request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate a command, an address, and data independently regardless of the request from the host 300 and transmit the command, the address, and the data to the memory device 100. For example, the memory controller 200 may provide the command, the address, and the data for performing a read operation and program operations accompanying in performing wear leveling, read reclaim, garbage collection, and the like, to the memory device 100.

In an embodiment, the memory controller 200 may control at least two memory devices 100. In this case, the memory controller 200 may control the memory devices 100 according to an interleaving method to improve operation performance. The interleaving method may be a method of controlling operations for at least two memory devices 100 to overlap with each other. Alternatively, the interleaving method may be a method in which at least two memory devices 100 operate in parallel.

The buffer memory (not shown) may temporarily store data provided from the host 300, that is, data to be stored in the memory device 100, or may temporarily store data read from the memory device 100. In an embodiment, the buffer memory (not shown) may be volatile memory. For example, the buffer memory (not shown) may be dynamic random access memory (DRAM) or static random access memory (SRAM).

The host 300 may communicate with the memory system 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
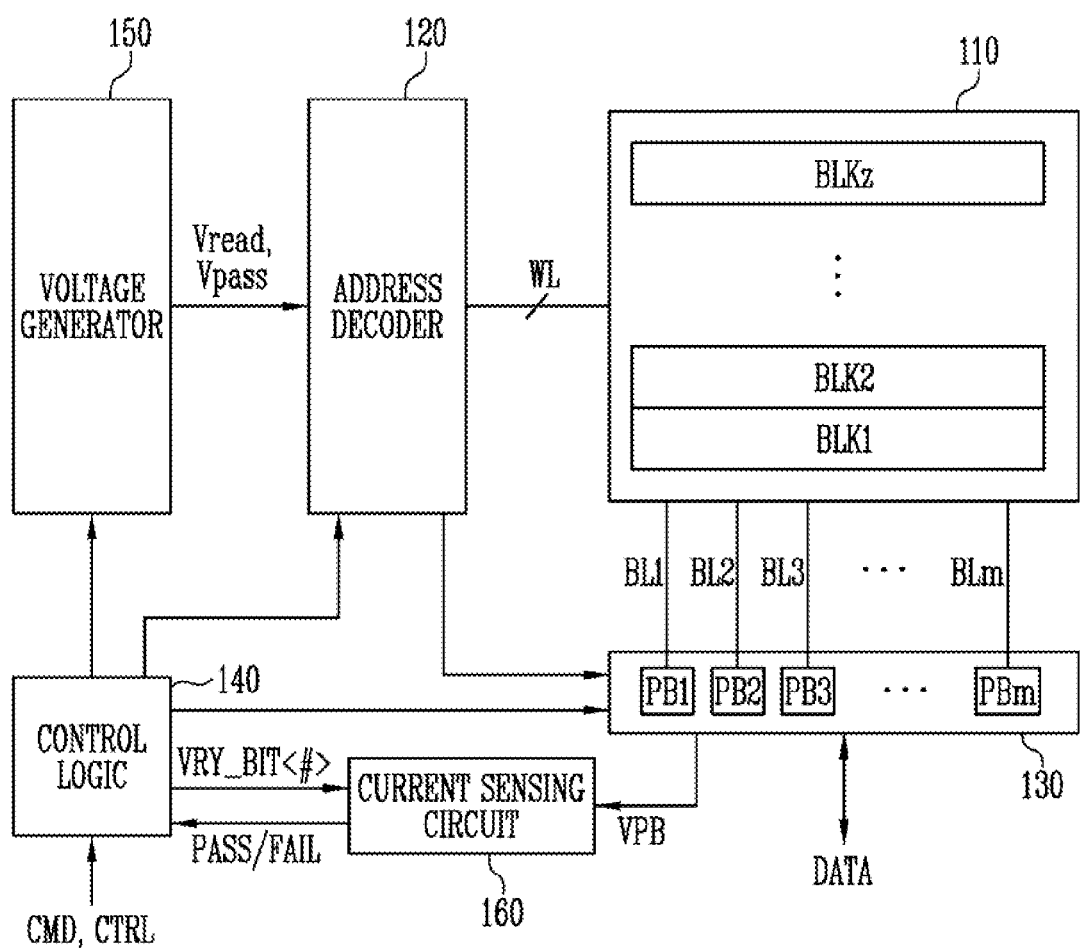
FIG. 2 is a diagram illustrating the memory device of FIG. 1.

FIG. 2 is a diagram illustrating the memory device of FIG. 1.

Referring to FIG. 2, the memory device 100 may include a memory cell array 110, an address decoder 120, a read and write circuit 130, a control logic circuit 140, a voltage generator 150, and a current sensing circuit 160. The address decoder 120, the read and write circuit 130, the voltage generator 150, and the current sensing circuit 160 may be collectively referred to as a peripheral circuit controlled by the control logic circuit 140.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read and write circuit 130 through bit lines BL1 to BLm. Each of the plurality of memory blocks BLK1 to BLKz may include a plurality of memory cells. In an embodiment, the plurality of memory cells are non-volatile memory cells, and may be configured with non-volatile memory cells having a vertical channel structure. The memory cell array 110 may be configured as a memory cell array having a two-dimensional structure. According to an embodiment, the memory cell array 110 may be configured as a memory cell array having a three-dimensional structure. Meanwhile, each of the plurality of memory cells included in the memory cell array may store at least one bit of data. In an embodiment, each of the plurality of memory cells included in the memory cell array 110 may be an SLC storing one bit of data. In another embodiment, each of the plurality of memory cells included in the memory cell array 110 may be an MLC storing two bits of data. In still another embodiment, each of the plurality of memory cells included in the memory cell array 110 may be a TLC storing three bits of data. In still another embodiment, each of the plurality of memory cells included in the memory cell array 110 may be a QLC storing four bits of data. According to an embodiment, the memory cell array 110 may include a plurality of memory cells each storing five or more bits of data.

The address decoder 120 may be connected to the memory cell array 110 through the word lines WL. The address decoder 120 may be configured to operate in response to the control of the control logic circuit 140. The address decoder 120 may receive an address through an input/output buffer (not shown) inside the memory device 100.

The address decoder 120 may be configured to decode a block address among received addresses. The address decoder 120 may select at least one memory block according to the decoded block address. In addition, the address decoder 120 may apply a read voltage Vread generated in the voltage generator 150 to a selected word line of the selected memory block at a time of a read voltage application operation during a read operation, and apply a pass voltage Vpass to the remaining unselected word lines. In addition, during a program verify operation, the address decoder 120 may apply a verify voltage generated in the voltage generator 150 to the selected word line of the selected memory block, and apply the pass voltage Vpass to the remaining unselected word lines.

The address decoder 120 may be configured to decode a column address of the received addresses. The address decoder 120 may transmit the decoded column address to the read and write circuit 130.

The read operation and the program operation of the memory device 100 may be performed in a page unit. Addresses received at a time of a request of the read operation and the program operation may include a block address, a row address, and a column address. The address decoder 120 may select one memory block and one word line according to the block address and the row address. The column address may be decoded by the address decoder 120 and may be provided to the read and write circuit 130. In the present specification, memory cells connected to one word line may be referred to as a "physical page".

The read and write circuit 130 may include a plurality of page buffers PB1 to PBm. The read and write circuit 130 may operate as a "read circuit" during the read operation of the memory cell array 110 and may operate as a "write circuit" during the write operation of the memory cell array 110. The plurality of page buffers PB1 to PBm may be connected to the memory cell array 110 through the bit lines BL1 to BLm. During the read operation and the program verify operation, in order to sense a threshold voltage of the memory cells, the plurality of page buffers PB1 to PBm may sense a change of an amount of a current flowing according to a programmed state of a corresponding memory cell through a sensing node while consecutively supplying a sensing current to the bit lines connected to the memory cells, and latch the sensed change as sensing data. The read and write circuit 130 may operate in response to page buffer control signals output from the control logic circuit 140. In the present specification, the write operation of the write circuit may be used with the same meaning as the program operation on the selected memory cells.

During the read operation, the read and write circuit 130 may sense data of the memory cell, temporarily store read data, and output data to the input/output buffer (not shown) of the memory device 100. In an embodiment, the read and write circuit 130 may include a column select circuit, and the like, in addition to the page buffers (or page registers). The read and write circuit 130 may be a page buffer according to an embodiment of the present disclosure.

The control logic circuit 140 may be connected to the address decoder 120, the read and write circuit 130, the voltage generator 150, and the current sensing circuit 160. The control logic circuit 140 may receive the command CMD and a control signal CTRL through the input/output buffer (not shown) of the memory device 100. The control logic circuit 140 may be configured to control overall operations of the memory device 100 in response to the control signal CTRL. In addition, the control logic circuit 140 outputs a control signal for adjusting a sensing node pre-charge potential level of the plurality of page buffers PB1 to PBm. The control logic circuit 140 may control the read and write circuit 130 to perform the read operation of the memory cell array 110.

Meanwhile, the control logic circuit 140 may determine whether a verify operation on a specific target program state has passed or failed in response to a pass signal PASS or a fail signal FAIL received from the current sensing circuit 160.

The voltage generator 150 generates the read voltage Vread and the pass voltage Vpass during the read operation in response to the control signal output from the control logic circuit 140. In order to generate a plurality of voltages having various voltage levels, the voltage generator 150 may include a plurality of pumping capacitors that receive an internal power voltage. The voltage generator 150 may generate the plurality of voltages by selectively activating the plurality of pumping capacitors in response to the control of the control logic circuit 140.

The current sensing circuit 160 may generate a reference current and a reference voltage in response to an allowable bit VRY_BTI<#> received from the control logic circuit 140 during a verify operation. A pass signal PASS or a fail signal FAIL may be output by comparing the generated reference voltage with a sensing voltage VPB received from the page buffers PB1 to PBm included in the read and write circuit 130 or comparing the generated reference current with a sensing current received from the page buffers PB1 to PBm included in the read and write circuit 130.

The address decoder 120, the read and write circuit 130, the voltage generator 150, and the current sensing circuit 160 may function as the "peripheral circuit" that performs the read operation, the write operation, and the erase operation on the memory cell array 110. The peripheral circuit may perform the read operation, the write operation, and the erase operation on the memory cell array 110 based on the control of the control logic circuit 140.

Figure 3:
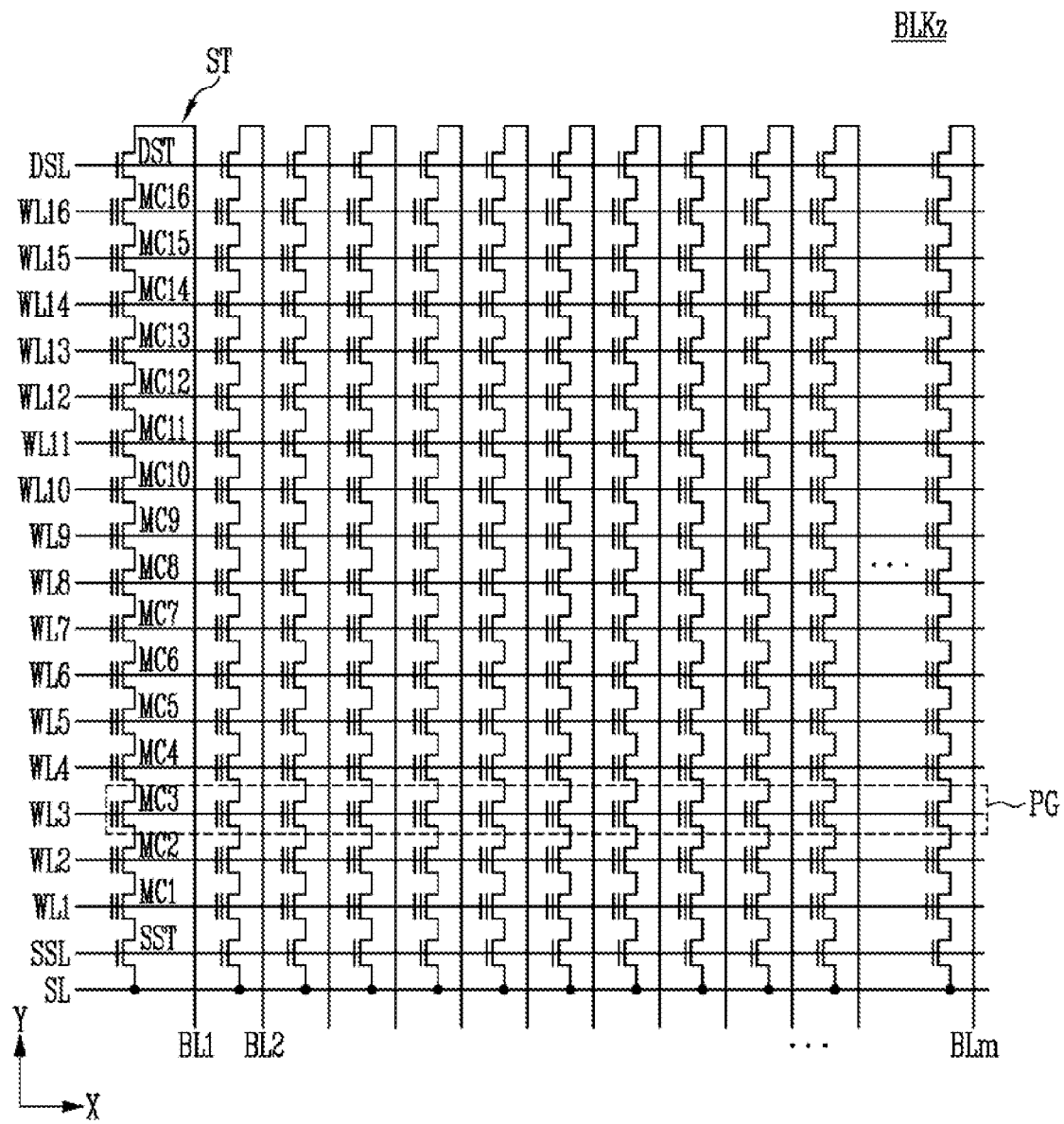
FIG. 3 is a diagram illustrating a configuration of any one memory block among memory blocks of FIG. 2.

FIG. 3 is a diagram illustrating a configuration of any one memory block among the memory blocks of FIG. 2.

In this instance, the memory block BLKz represents any one memory block among the memory blocks BLK1 to BLKz of FIG. 2.

Referring to FIG. 3, a plurality of word lines arranged in parallel with each other may be connected between a first select line and a second select line. Here, the first select line may be the source select line SSL, and the second select line may be the drain select line DSL. More specifically, the memory block BLKz may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured identically to each other, a string connected to the first bit line BL1 is specifically described as an example.

The string may include a source select transistor SST, a plurality of memory cells MC1 to MC16, and a drain select transistor DST connected in series between the source line SL and the first bit line BL1. One string may include at least one or more of the source select transistor SST and the drain select transistor DST, and may include more memory cells than the sixteen memory cells MC1 to MC16 shown in FIG. 3.

A source of the source select transistor SST may be connected to the source line SL, and a drain of the drain select transistor DST may be connected to the first bit line BL1. The memory cells MC1 to MC16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells MC1 to MC16 may be connected to the plurality of word lines WL1 to WL16. A group of the memory cells connected to the same word line among the memory cells included in different strings ST may be referred to as a page PG. Therefore, the memory block BLKz may include the pages PG of the number of the word lines WL1 to WL16.

One memory cell may store one bit of data. This is commonly called an SLC. In this case, one physical page PG may store one logical page (LPG) data. The one logical page (LPG) data may include data bits of the same number as cells included in one physical page PG.

The one memory cell may store two or more bits of data. In this case, one physical page PG may store two or more logical page (LPG) data.

FIG. 4 is a diagram illustrating a plurality of program loops included in a program operation, and a program voltage apply operation and a verify operation included in each program loop.

Referring to FIG. 4, the program operation may include the plurality of program loops. As shown in FIG. 4, the program operation may be started by performing a first program loop $1^{st}$ PGM Loop. When the program operation on the selected memory cells is not completed even though the first program loop $1^{st}$ PGM Loop is performed, a second program loop $2^{nd}$ PGM Loop may be performed. When the program operation on the selected memory cells is not completed even though the second program loop $2^{nd}$ PGM Loop is performed, a third program loop $3^{rd}$ PGM Loop may be performed. In such a method, the program loops may be repeatedly performed until the program operation is completed.

Meanwhile, when the program operation is not completed even though the program loop is repeated up to a predetermined maximum number of program loops, it may be determined that the program operation has failed.

FIG. 5A and FIG. 5B are diagrams illustrating a threshold voltage distribution of an SLC.

Referring to FIG. 5A and FIG. 5B, a horizontal axis indicates a threshold voltage of a memory cell, and a vertical axis indicates the number of memory cells.

The memory device may perform the program operation in a word line unit. A plurality of memory cells connected to one word line may configure one physical page. The physical page may be a unit of the program operation or the read operation.

The memory device may perform the program operation to store data in memory cells connected to a selected word line among a plurality of word lines.

Selected memory cells, which are memory cells connected to the selected word line, may have a threshold voltage distribution corresponding to an erase state E as shown in FIG. 5A before the program operation is performed.

When the memory cell stores data corresponding to one bit, the memory cell may be programmed to have a threshold voltage corresponding to any one of the erase state E or a first program state P1.

The erase state E may correspond to data '1', and the first program state P1 may correspond to data '0'. However, the data corresponding to the first program state P1 is an example, and the erase state E may correspond to data '0', and the first program state P1 may correspond to data '1'.

When the program operation has ended, the selected memory cells may have the threshold voltage corresponding to any one of the erase state E or the first program state P1 as shown in FIG. 5B. The memory device may read data stored in the selected memory cells by performing a read operation using a first read voltage R1 between the erase state E and the first program state P1.

Figure 6A:
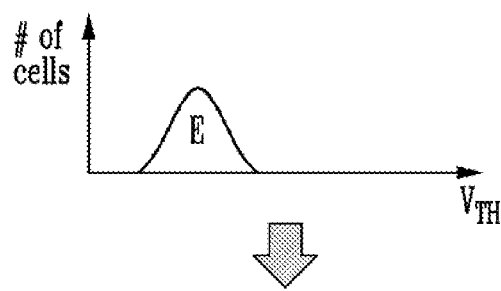
FIGS. 6A and 6B are diagrams illustrating a threshold voltage distribution of a multi-level cell.
Figure 6B:
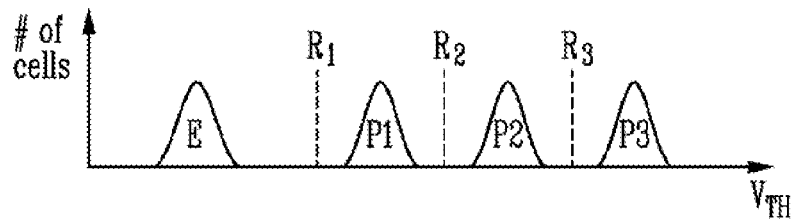

FIG. 6A and FIG. 6B are diagrams illustrating a threshold voltage distribution of an MLC.

Referring to FIG. 6A and FIG. 6B, a horizontal axis indicates a threshold voltage of a memory cell, and a vertical axis indicates the number of memory cells.

Selected memory cells, which are memory cells connected to the selected word line, may have a threshold voltage distribution corresponding to an erase state E as shown in FIG. 6A before the program operation is performed.

When the memory cell stores data corresponding to two bits, the memory cell may be programmed to have a threshold voltage corresponding to any one of the erase state E, a first program state P1, a second program state P2, and a third program state P3.

The erase state E may correspond to data '11', the first program state P1 may correspond to data '10', the second program state P2 may correspond to data '00', and the third program state P3 may correspond to data '01'. However, the data corresponding to each program state is an example and may be variously modified.

When the program operation has ended, the selected memory cells may have the threshold voltage corresponding to any one of the erase state E, the first program state P1, the second program state P2, and the third program state P3 as shown in FIG. 6B. The memory device may read data stored in the selected memory cells by performing a read operation using first to third read voltages R1 to R3.

The first read voltage R1 may be a read voltage that distinguishes between the erase state E and the first program state P1, the second read voltage R2 may be a read voltage that distinguishes between the first program state P1 and the second program state P2, and the third read voltage R3 may be a read voltage that distinguishes the second program state P2 and the third program state P3.

FIG. 7A and FIG. 7B are diagrams illustrating a threshold voltage distribution of a TLC.

Referring to FIG. 7A and FIG. 7B, a horizontal axis indicates a threshold voltage of a memory cell, and a vertical axis indicates the number of memory cells.

Selected memory cells, which are memory cells connected to the selected word line, may have a threshold voltage distribution corresponding to an erase state E as shown in FIG. 7A before the program operation is performed.

When the memory cell stores three bits of data, the memory cell may be programmed to have a threshold voltage corresponding to any one of the erase state E, a first program state P1, a second program state P2, a third program state P3, a fourth program state P4, a fifth program state P5, a sixth program state P6, and a seventh program state P7.

The erase state E may correspond to data '111', the first program state P1 may correspond to data '110', the second program state P2 may correspond to data '101', the third program state P3 may correspond to data '100', the fourth program state P4 may correspond to data '011', the fifth program state P5 may correspond to data '010', the sixth program state P6 may correspond to data '001', and the seventh program state P7 may correspond to data '000'. However, the data corresponding to each program state is an example and may be variously modified.

When the program operation has ended, the selected memory cells may have the threshold voltage corresponding to any one of the erase state E, the first program state P1, the second program state P2, the third program state P3, the fourth program state P4, the fifth program state P5, the sixth program state P6, and the seventh program state P7 as shown in FIG. 7B. The memory device may read data stored in the selected memory cells by performing a read operation using first to seventh read voltages R1 to R7.

The first read voltage R1 may be a read voltage that distinguishes between the erase state E and the first program state P1, the second read voltage R2 may be a read voltage that distinguishes between the first program state P1 and the second program state P2, the third read voltage R3 may be a read voltage that distinguishes between the second program state P2 and the third program state P3, the fourth read voltage R4 may be a read voltage that distinguishes between the third program state P3 and the fourth program state P4, the fifth read voltage R5 may be a read voltage that distinguishes between the fourth program state P4 and the fifth program state P5, the sixth read voltage R6 may be a read voltage that distinguishes between the fifth program state P5 and the sixth program state P6, and the seventh read voltage R7 may be a read voltage that distinguishes between the sixth program state P6 and the seventh program state P7.

FIG. 8A and FIG. 8B are diagrams illustrating a threshold voltage distribution of a QLC.

Referring to FIG. 8A and FIG. 8B, a horizontal axis indicates a threshold voltage of a memory cell, and a vertical axis indicates the number of memory cells.

Selected memory cells, which are memory cells connected to the selected word line, may have a threshold voltage distribution corresponding to an erase state E as shown in FIG. 8A before the program operation is performed.

When the memory cell stores data corresponding to four bits, the memory cell may be programmed to have a threshold voltage corresponding to any one of the erase state E and first to fifteenth program states P1 to P15.

The erase state E may correspond to data '1111', the first program state P1 may correspond to data '1110', the second program state P2 may correspond to data '1101', the third program state P3 may correspond to data '1100', the fourth program state P4 may correspond to data '1011', the fifth program state P5 may correspond to data '1010', the sixth program state P6 may correspond to data '1001', the seventh program state P7 may correspond to data '1000'. In addition, the eighth program state P8 may correspond to data '0111', the ninth program state P9 may correspond to data '0110', the tenth program state P10 may correspond to data '0101', the eleventh program state P11 may correspond to data '0100', the twelfth program state P12 may correspond to data '0011', the thirteenth program state P13 may correspond to data '0010', the fourteenth program state P14 may correspond to data '0001', and the fifteenth program state P15 may correspond to data '0000'. However, the data corresponding to each program state is an example and may be variously modified.

When the program operation has ended, the selected memory cells may have the threshold voltage corresponding to any one of the erase state E and the first to fifteenth program states P1 to P15 as shown in FIG. 8B. The memory device may read data stored in the selected memory cells by performing a read operation using first to fifteenth read voltages R1 to R15.

The first read voltage R1 may be a read voltage that distinguishes between the erase state E and the first program state P1, the second read voltage R2 may be a read voltage that distinguishes between the first program state P1 and the second program state P2, the third read voltage R3 may be a read voltage that distinguishes between the second program state P2 and the third program state P3, the fourth read voltage R4 may be a read voltage that distinguishes between the third program state P3 and the fourth program state P4, the fifth read voltage R5 may be a read voltage that distinguishes between the fourth program state P4 and the fifth program state P5, the sixth read voltage R6 may be a read voltage that distinguishes between the fifth program state P5 and the sixth program state P6, the seventh read voltage R7 may be a read voltage that distinguishes between the sixth program state P6 and the seventh program state P7, the eighth read voltage R8 may be a read voltage that distinguishes between the seventh program state P7 and the eighth program state P8, the ninth read voltage R9 may be a read voltage that distinguishes between the eighth program state P8 and the ninth program state P9, the tenth read voltage R10 may be a read voltage that distinguishes between the ninth program state P9 and the tenth program state P10, the eleventh read voltage R11 may be a read voltage that distinguishes between the tenth program state P10 and the eleventh program state P11, the twelfth read voltage R12 may be a read voltage that distinguishes between the eleventh program state P11 and the twelfth program state P12, the thirteenth read voltage R13 may be a read voltage that distinguishes between the twelfth program state P12 and the thirteenth program state P13, the fourteenth read voltage R14 may be a read voltage that distinguishes between the thirteenth program state P13 and the fourteenth program state P14, and the fifteenth read voltage R15 may be a read voltage that distinguishes between the fourteenth program state P14 and the fifteenth program state P15.

Figure 9:
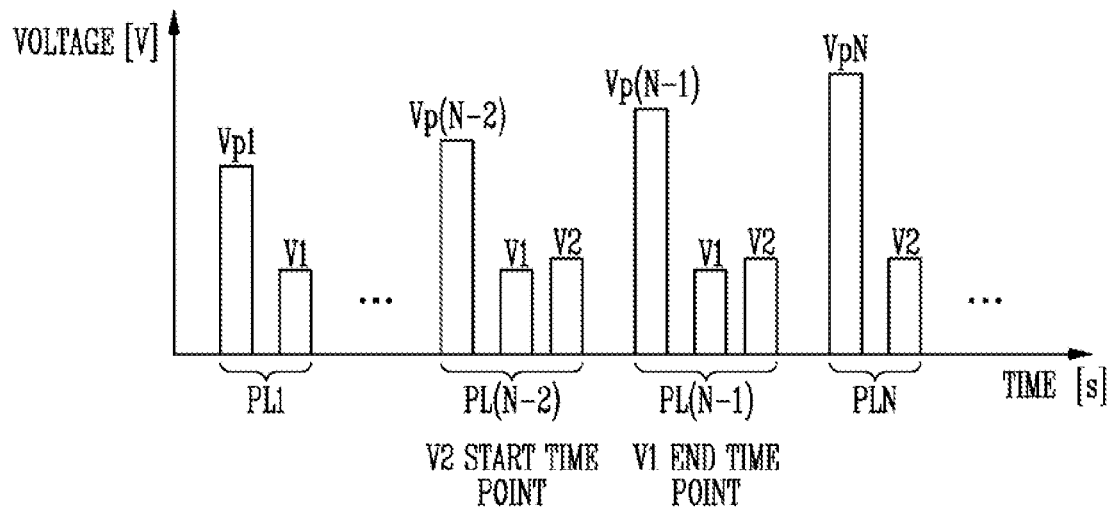
FIG. 9 is a diagram illustrating a start time point and an end time point of a verify operation in a plurality of program loops according to an embodiment of the present disclosure.

FIG. 9 is a diagram illustrating a start time point and an end time point of a verify operation in a plurality of program loops according to an embodiment of the present disclosure.

In FIG. 9, it is assumed that each of the plurality of memory cells is an MLC, a TLC, or a QLC. Referring to FIG. 9, a plurality of program loops are shown. Each of the plurality of program loops may include the program voltage apply operation and the verify operation. After the program voltage is applied, verify operations on a plurality of program levels may be performed. In FIG. 9, a horizontal axis may indicate a time and a vertical axis may indicate a magnitude of voltage.

According to an embodiment of the present disclosure, a program time may be shortened by performing verify operations on a specific program level without performing a verify operation on all program levels. The program level on which the verify operation is performed may be determined based on the number of fail bits for a voltage applied to the word line.

In FIG. 9, when a first program loop PL1 is performed, after a first program voltage Vp1 is applied, a first verify voltage V1 may be applied to verify a program level of the plurality of memory cells. The first verify voltage V1 may be a voltage applied to the word line to verify a first program level.

When an (N−2)-th program loop PL(N−2) is performed, an (N−2)-th program voltage Vp(N−2) may be applied. In the (N−2)-th program loop PL(N−2), the first verify voltage V1 and a second verify voltage V2 may be sequentially applied. The second verify voltage V2 may be a voltage applied to the word line to verify a second program level. The (N−2)-th program loop PL(N−2) to which the second verify voltage V2 is applied may be a start time point of a verify operation corresponding to the second verify voltage V2. The second verify voltage V2 is first applied in the (N−2)-th program loop PL(N−2).

In an embodiment of the present disclosure, the first verify voltage V1 may be applied up to an (N−1)-th program loop PL(N−1). The (N−1)-th program loop PL(N−1) to which the first verify voltage V1 is last applied may be an end time point of the verify operation corresponding to the first verify voltage V1. In an N-th program loop PLN, only a verify operation for the second verify voltage V2 might be performed.

In an embodiment of the present disclosure, the start time point of the verify operation corresponding to the second program level may be determined as the (N−2)-th program loop PL(N−2) through the verify operation performed in the first program loop PL1. The end time point of the verify operation corresponding to the first program level may be determined as the (N−1)-th program loop PL(N−1) through the verify operation performed in the first program loop PL1.

Similarly, the start time point and the end time point of the verify operation corresponding to each of the plurality of program levels may be determined.

Figure 10:
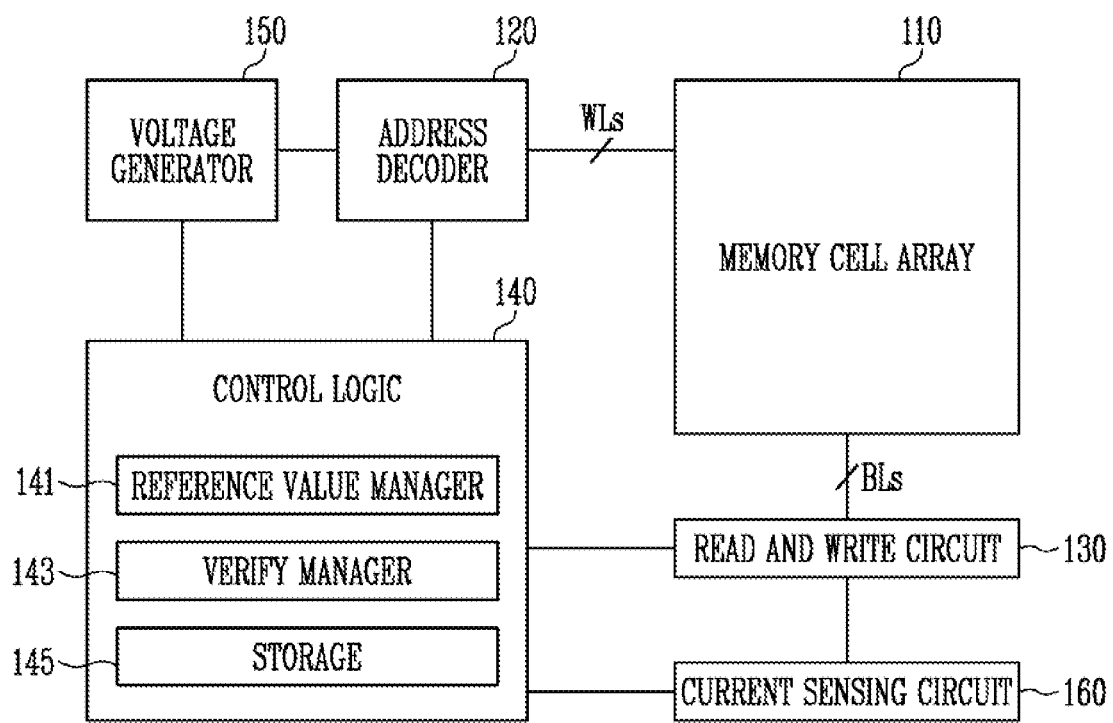
FIG. 10 is a block diagram illustrating a method of performing a verify operation according to an embodiment of the present disclosure.

FIG. 10 is a block diagram illustrating a method of performing a verify operation according to an embodiment of the present disclosure.

Referring to FIG. 10, the control logic circuit 140 may control the address decoder 120, the read and write circuit 130, the voltage generator 150, and the current sensing circuit 160.

According to an embodiment of the present disclosure, the control logic circuit 140 may transmit a control signal to the read and write circuit 130 and the current sensing circuit 160. The memory cell array 110 includes the plurality of memory blocks BLK1 to BLKz. The plurality of memory blocks BLK1 to BLKz are connected to the read and write circuit 130 through the bit lines BLs. Each of the plurality of memory blocks BLK1 to BLKz includes a plurality of memory cells.

The address decoder 120 may be connected to the memory cell array 110 through the word lines WLs. The address decoder 120 may apply the voltage generated by the voltage generator 150 to the selected memory cells through the word line.

The read and write circuit 130 includes the plurality of page buffers PB1 to PBm. The plurality of page buffers PB1 to PBm are connected to the memory cell array 110 through the bit lines BL1 to BLm. The plurality of page buffers PB1 to PBm transmit sensing data obtained by sensing a change in a current amount flowing according to a program state of a corresponding memory cell to the current sensing circuit 160.

The voltage generator 150 may generate various voltages by the control logic circuit 140. The voltage generator 150 may generate a verify voltage of the program level, a read voltage of the program level, and a double verify voltage of the program level. The generated voltage may be applied to the selected memory cells through the word line.

The current sensing circuit 160 may receive the sensing data from the read and write circuit 130 and perform a current sensing operation. The current sensing operation may be an operation of determining whether the memory cells are programmed to a target state, and may include an individual current sensing operation and an overall current sensing operation.

The current sensing circuit 160 may generate a reference current and a reference voltage in response to a preset allowable bit, and may generate a verify current and a verify voltage according to the sensing data. The current sensing circuit 160 may compare the reference voltage and the verify voltage with each other and transmit a pass signal or a fail signal to the control logic circuit 140.

In an embodiment of the present disclosure, the current sensing circuit 160 may count the number of fail bits by comparing the verify voltage applied to the word line with the threshold voltage of the memory cells. The current sensing circuit 160 may transmit information on the counted number of fail bits to the control logic circuit 140.

In another embodiment of the present disclosure, the control logic circuit 140 may include a fail bit counter. The fail bit counter may count the number of fail bits by comparing the verify voltage applied to the word line with the threshold voltage of the memory cells based on a signal received from the current sensing circuit 160.

The control logic circuit 140 may control the address decoder 120, the read and write circuit 130, the voltage generator 150, and the current sensing circuit 160 to perform the verify operation of comparing the threshold voltages of the memory cells with the verify voltage on each of the plurality of program levels. The control logic circuit 140 may control the address decoder 120 and the voltage generator 150 to apply a plurality of blind voltages related to or associated with a target level among the plurality of program levels to the word line. The control logic circuit 140 may determine a start time point of a verify operation corresponding to a next program level of the target level using the number of fail bits for each of the plurality of blind voltages.

The plurality of blind voltages generated by the voltage generator 150 may include a verify voltage of the target level, a read voltage of the target level, a double verify voltage of a next program level of the target level, or a verify voltage of the next program level of the target level.

The control logic circuit 140 may include a reference value manager 141, a verify manager 143, and storage 145.

The reference value manager 141 may control the address decoder 120 and the voltage generator 150 to apply two or more of the plurality of blind voltages to the word line. The reference value manager 141 may determine a reference value for the number of fail bits. In an embodiment of the present disclosure, the reference value manager 141 may determine the reference value based on the number of fail bits stored in a lookup table according to a pre-program pulse.

The verify manager 143 may determine a target voltage having the number of fail bits closest to the reference value among the plurality of blind voltages. The verify manager 143 may determine the start time point of the verify operation corresponding to the next program level of the target level based on the number of fail bits for the target voltage. In an embodiment of the present disclosure, the verify manager 143 may determine an end time point of a verify operation corresponding to the target level based on the number of fail bits for the target voltage.

The storage 145 may store information on the number of fail bits for each of the plurality of blind voltages, the reference value, or the target voltage.

In another embodiment of the present disclosure, the control logic circuit 140 may control the address decoder 120 and the voltage generator 150 to apply the plurality of blind voltages related to the first level among the plurality of program levels to the word line in a voltage magnitude order. For an embodiment, a voltage magnitude order is an order of increasing voltage magnitudes. The control logic circuit 140 may determine a start time point of the verify operation corresponding to the second level that is a next program level of the first level using the number of fail bits for each of the plurality of blind voltages.

The plurality of blind voltages generated by the voltage generator 150 may include a verify voltage of the first level, a read voltage of the first level, a double verify voltage of the second level, or a verify voltage of the second level.

The reference value manager 141 may control the address decoder 120 and the voltage generator 150 to apply the plurality of blind voltages related to the first level in the voltage magnitude order until a target voltage having the number of fail bits greater than or equal to the reference value is applied to the word line. The reference value manager 141 may determine the start time point of the verify operation corresponding to the second level based on the number of fail bits for the target voltage. The reference value manager 141 may determine an end time point of a verify operation corresponding to the first level based on the number of fail bits for the target voltage.

Figure 11:
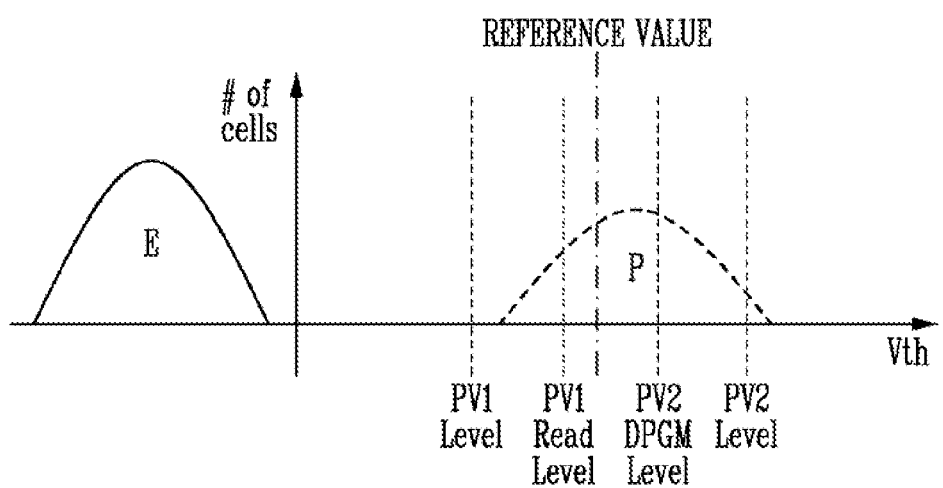
FIG. 11 is a diagram illustrating a method of determining a target voltage from among a plurality of blind voltages according to an embodiment of the present disclosure.

FIG. 11 is a diagram illustrating a method of determining a target voltage from among a plurality of blind voltages according to an embodiment of the present disclosure.

Referring to FIG. 11, a threshold voltage distribution of the memory cells may be increased by the program voltage applied to the word line. After the program voltage is applied, the plurality of blind voltages may be applied. A vertical axis of FIG. 11 may indicate the number of memory cells, and a horizontal axis may indicate the threshold voltage of the memory cells.

In FIG. 11, it may be assumed that the first program loop is being performed. When the program voltage is applied to the word line of the memory cells in the erase state E, the threshold voltage distribution of the memory cells may be changed to P. The control logic circuit 140 may perform the verify operation after the program voltage is applied.

In an embodiment of the present disclosure, the control logic circuit 140 may control the address decoder and the voltage generator to apply a plurality of blind voltages related to a first verify level to the word line. The plurality of blind voltages applied to the memory cells through the word line may include a first verify voltage corresponding to the first verify level, a first read voltage, a second verify voltage corresponding to a second verify level, and a second double verify voltage.

In an embodiment of the present disclosure, the control logic circuit 140 may obtain information on the number of fail bits for each of the plurality of blind voltages. The control logic circuit 140 may determine a start time point of a verify operation corresponding to the second verify level based on the number of fail bits.

During the verify operation, the control logic circuit 140 may count the first number of fail bits in response to the first verify voltage applied to the word line. During the verify operation, the control logic circuit 140 may count the second number of fail bits in response to the first read voltage applied to the word line. During the verify operation, the control logic circuit 140 may count the third number of fail bits in response to the second double verify voltage applied to the word line. During the verify operation, the control logic circuit 140 may count the fourth number of fail bits in response to the second verify voltage applied to the word line.

For example, the threshold voltage distribution of the memory cells may be changed to P due to the program voltage applied to the word line of the memory cells in the erase state E. The reference value manager 141 may determine the reference value for determining the target voltage from among the plurality of blind voltages. In an embodiment of the present disclosure, the reference value manager 141 may determine the reference value based on the number of fail bits stored in the lookup table according to the pre-program pulse.

The control logic circuit 140 may compare the reference value with each of the first number of fail bits, the second number of fail bits, the third number of fail bits, and the fourth number of fail bits. In FIG. 11, the threshold voltages of the memory cells may increase to be higher than the first verify voltage due to the first program voltage, and thus the first number of fail bits may be 0. The verify manager 143 may determine the target voltage having the number of fail bits closest to the reference value among the plurality of blind voltages.

In FIG. 11, the blind voltage closest to the reference value is the first read voltage. According to an embodiment of the present disclosure, the first read voltage may be determined as the target voltage. The verify manager 143 may determine the start time point of the verify operation corresponding to the second verify level based on the second number of fail bits counted in response to the first read voltage. The verify manager 143 may determine an end time point of a verify operation corresponding to the first verify level based on the second number of fail bits.

The number of fail bits corresponding to the target voltage may indicate a program speed of the memory cells. For example, as the program speed of the memory cells increases, the number of fail bits corresponding to the target voltage may be decreased. Conversely, as the program speed of the memory cells decreases, the number of fail bits corresponding to the target voltage may be increased. The verify manager 143 may adjust the start time point of the verify operation corresponding to the next program level of the target level according to the number of fail bits.

In another embodiment of the present disclosure, the control logic circuit 140 may control the address decoder 120 and the voltage generator 150 to apply the plurality of blind voltages related to the first verify level to the word line in the voltage magnitude order. The reference value manager 141 may determine the reference value for determining the target voltage from among the plurality of blind voltages. During the verify operation, the verify manager 143 may compare the number of fail bits for the voltage applied to the word line with the reference value. The verify manager 143 may determine the target voltage having the number of fail bits greater than or equal to the reference value. The verify manager 143 may determine the start time point of the verify operation corresponding to the second verify level based on the number of fail bits for the target voltage.

According to another embodiment of the present disclosure, in FIG. 11, the verify manager 143 may determine the target voltage as the second double verify voltage. The second double verify voltage may be a blind voltage having the number of fail bits greater than the reference value.

Figure 12:
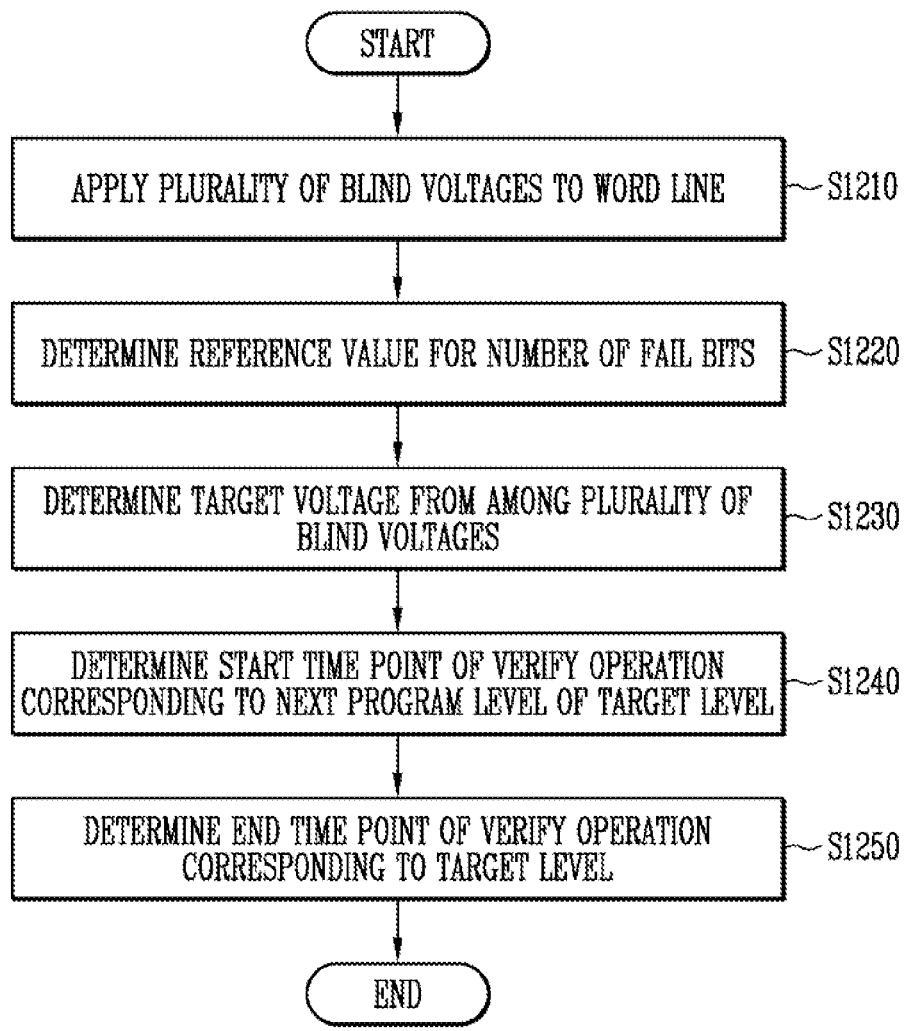
FIG. 12 is a flowchart illustrating a method of performing a verify operation according to an embodiment of the present disclosure.

FIG. 12 is a flowchart illustrating a method of performing a verify operation according to an embodiment of the present disclosure.

Referring to FIG. 12, during the verify operation, the control logic circuit 140 may count the number of fail bits for the plurality of blind voltages applied to the word line to determine the target voltage. The control logic circuit 140 may determine the start time point of the verify operation corresponding to the next program level of the target level based on the number of fail bits for the target voltage.

In step S1210, the control logic circuit 140 may control the peripheral circuit to apply the plurality of blind voltages related to the target level among the plurality of program levels to the word line. The reference value manager 141 may control the address decoder and the voltage generator to apply two or more of the plurality of blind voltages to the word line.

In step S1220, the reference value manager 141 may determine the reference value for the number of fail bits. In an embodiment of the present disclosure, the reference value manager 141 may determine the reference value based on the number of fail bits stored in the lookup table according to the pre-program pulse.

In step S1230, the verify manager 143 may determine the target voltage from among the plurality of blind voltages. In an embodiment of the present disclosure, the verify manager 143 may determine the target voltage having the number of fail bits closest to the reference value among the plurality of blind voltages.

In step S1240, the verify manager 143 may determine the start time point of the verify operation corresponding to the next program level of the target level. In an embodiment of the present disclosure, the verify manager 143 may determine the start time point of the verify operation corresponding to the next program level of the target level based on the number of fail bits for the target voltage.

In step S1250, the verify manager 143 may determine the end time point of the verify operation corresponding to the target level. In an embodiment of the present disclosure, the verify manager 143 may determine the end time point of the verify operation corresponding to the target level based on the number of fail bits for the target voltage.

Figure 13:
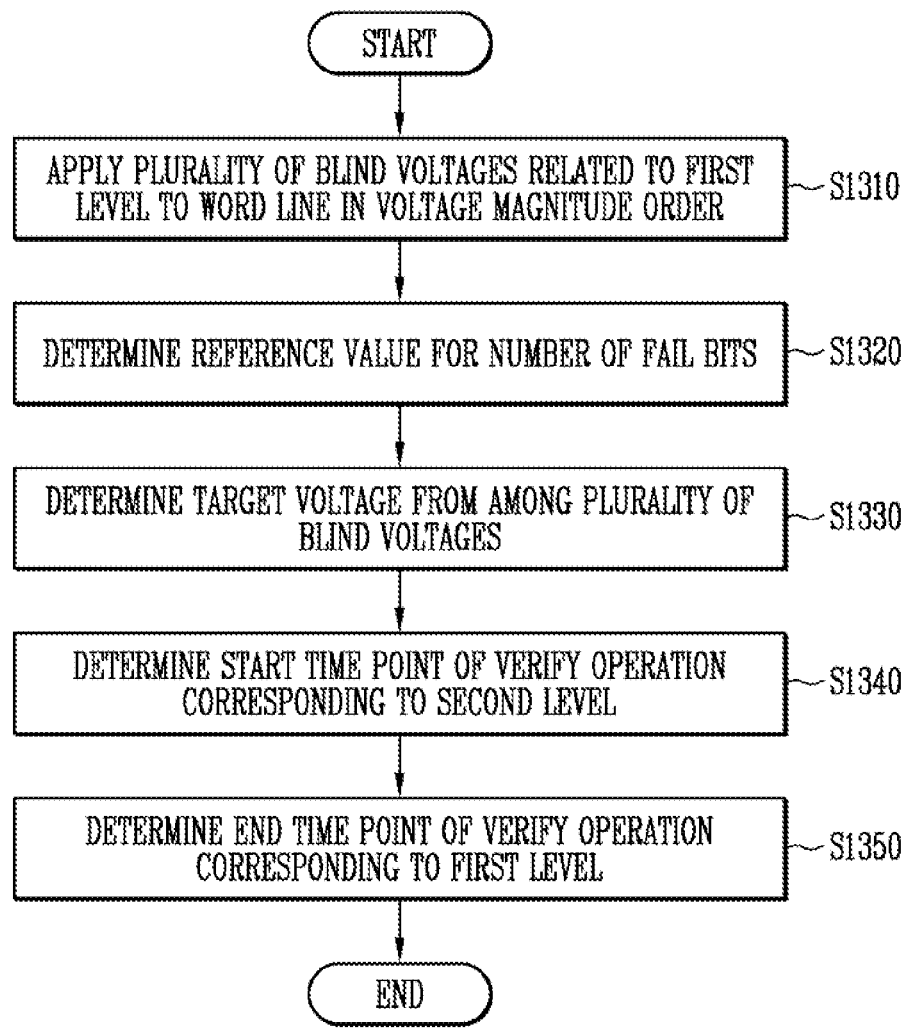
FIG. 13 is a flowchart illustrating a method of performing a verify operation according to another embodiment of the present disclosure.

FIG. 13 is a flowchart illustrating a method of performing a verify operation according to another embodiment of the present disclosure.

Referring to FIG. 13, during the verify operation, the control logic circuit 140 may compare the number of fail bits for the plurality of blind voltages applied to the word line in the voltage magnitude order with the reference value. When the target voltage having the number of fail bits greater than or equal to the reference value is detected, the control logic circuit 140 might not apply a voltage to the word line. The control logic circuit 140 may determine the start time point of the verify operation corresponding to the next program level of the target level based on the number of fail bits for the target voltage.

In step S1310, the control logic circuit 140 may control the peripheral circuit to apply the plurality of blind voltages related to the first level to the word line in the voltage magnitude order. The control logic circuit 140 may control the address decoder and the voltage generator to apply the plurality of blind voltages related to the first level among the plurality of program levels to the word line in the voltage magnitude order. The plurality of blind voltages generated by the voltage generator may include the verify voltage of the first level, the read voltage of the first level, the double verify voltage of the second level, or the verify voltage of the second level.

In step S1320, the reference value manager 141 may determine the reference value for the number of fail bits. In an embodiment of the present disclosure, the reference value manager 141 may determine the reference value based on the number of fail bits stored in the lookup table according to the pre-program pulse.

In step S1330, the verify manager 143 may determine the target voltage from among the plurality of blind voltages. In an embodiment of the present disclosure, the reference value manager 141 may control the address decoder and the voltage generator to apply the plurality of blind voltages related to the first level in the voltage magnitude order until the target voltage having the number of fail bits greater than or equal to the reference value is applied to the word line. The reference value manager 141 might not apply the blind voltage to the word line in response to the determination of the target voltage.

In step S1340, the verify manager 143 may determine the start time point of the verify operation corresponding to the second level. In an embodiment of the present disclosure, the reference value manager 141 may determine the start time point of the verify operation corresponding to the second level based on the number of fail bits for the target voltage.

In step S1350, the verify manager 143 may determine the end time point of the verify operation corresponding to the first level. In an embodiment of the present disclosure, the reference value manager 141 may determine the end time point of the verify operation corresponding to the first level based on the number of fail bits for the target voltage.

Figure 14:
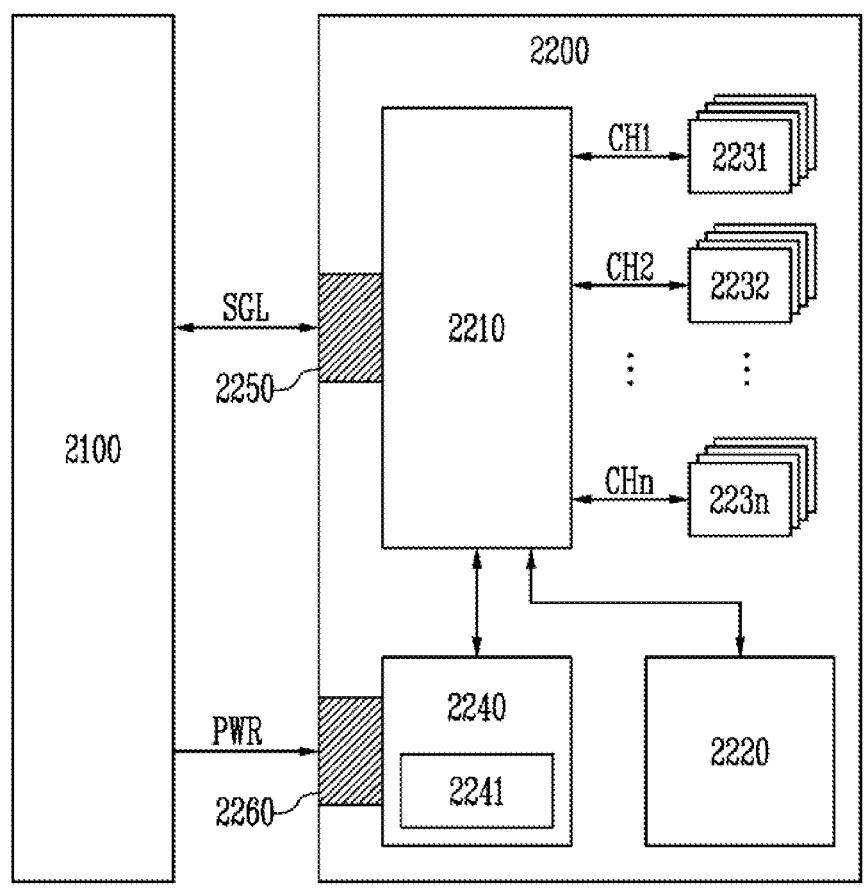
FIG. 14 is a diagram illustrating a data processing system including a solid state drive according to an embodiment of the present disclosure.

FIG. 14 is a diagram illustrating a data processing system including a solid state drive (SSD) according to an embodiment of the present disclosure. Referring to FIG. 14, the data processing system 2000 may include a host device 2100 and an SSD 2200.

The SSD 2200 may include a controller 2210, a buffer memory device 2220, nonvolatile memories 2231 to 223n, a power supply 2240, a signal connector 2250, and a power connector 2260.

The controller 2210 may control an overall operation of the SSD 2200.

The buffer memory device 2220 may temporarily store data to be stored in the nonvolatile memories 2231 to 223n. In addition, the buffer memory device 2220 may temporarily store data read from the nonvolatile memories 2231 to 223n. The data temporarily stored in the buffer memory device 2220 may be transmitted to the host device 2100 or the nonvolatile memories 2231 to 223n under control of the controller 2210.

The nonvolatile memories 2231 to 223n may be used as a storage medium of the SSD 2200. Each of the nonvolatile memories 2231 to 223n may be connected to the controller 2210 through a plurality of channels CH1 to CHn. One or more nonvolatile memories may be connected to one channel. The nonvolatile memories connected to one channel may be connected to the same signal bus and data bus.

The power supply 2240 may provide power PWR input through the power connector 2260 into the SSD 2200. The power supply 2240 may include an auxiliary power supply 2241. The auxiliary power supply 2241 may supply power so that the SSD 2200 is normally shut down when a sudden power off occurs. The auxiliary power supply 2241 may include large capacity capacitors capable of charging the power PWR.

The controller 2210 may exchange a signal SGL with the host device 2100 through the signal connector 2250. Here, the signal SGL may include a command, an address, data, and the like. The signal connector 2250 may be configured as various types of connectors according to an interface method between the host device 2100 and the SSD 2200.

Figure 15:
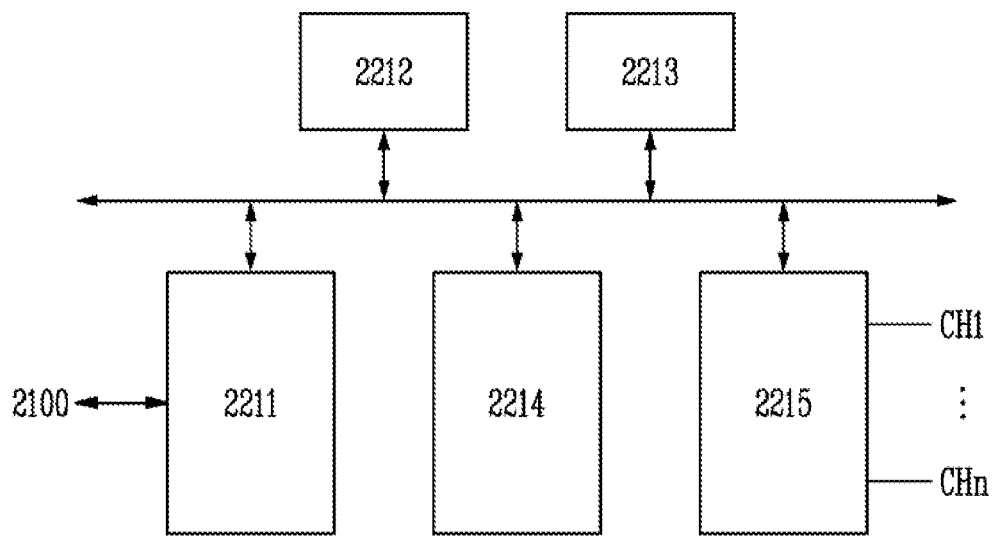
FIG. 15 is a diagram illustrating a configuration of the controller of FIG. 14.

FIG. 15 is a diagram illustrating a configuration of the controller of FIG. 14. Referring to FIG. 15, the controller 2210 may include a host interface unit 2211, a control unit 2212, a random access memory 2213, an error correction code (ECC) unit 2214, and a memory interface unit 2215.

The host interface unit 2211 may interface the host device 2100 and the SSD 2200 according to a protocol of the host device 2100. For example, the host interface unit 2211 may communicate with the host device 2100 through any one of secure digital, universal serial bus (USB), multi-media card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI Express (PCI-E), and universal flash storage (UFS) protocols. In addition, the host interface unit 2211 may perform a disk emulation function that supports the host device 2100 to recognize the SSD 2200 as a general-purpose data storage device, for example, a hard disk drive (HDD).

The control unit 2212 may analyze and process the signal SGL input from the host device 2100. The control unit 2212 may control an operation of internal functional blocks according to firmware or software for driving the SSD 2200. The random access memory 2213 may be used as an operation memory for driving such firmware or software.

The ECC unit 2214 may generate parity data of data to be transmitted to the nonvolatile memories 2231 to 223n. The generated parity data may be stored in the nonvolatile memories 2231 to 223n together with the data. The ECC unit 2214 may detect an error of data read from the nonvolatile memories 2231 to 223n based on the parity data. When the detected error is within a correction range, the ECC unit 2214 may correct the detected error.

The memory interface unit 2215 may provide a control signal such as a command and an address to the nonvolatile memories 2231 to 223n under control of the control unit 2212. In addition, the memory interface unit 2215 may exchange data with the nonvolatile memories 2231 to 223n under the control of the control unit 2212. For example, the memory interface unit 2215 may provide the data stored in the buffer memory device 2220 to the nonvolatile memories 2231 to 223n, or provide the data read from the nonvolatile memories 2231 to 223n to the buffer memory device 2220.

Figure 16:
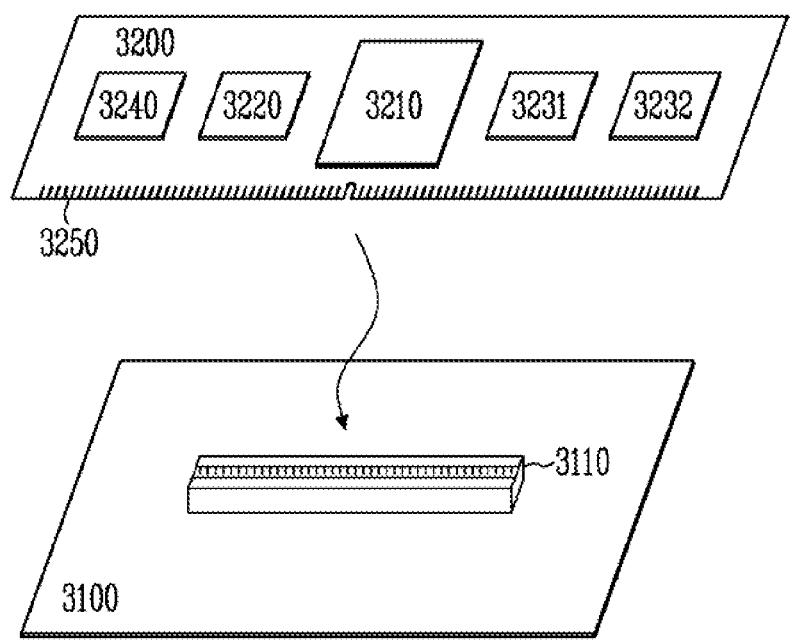
FIG. 16 is a diagram illustrating a data processing system including a data storage device according to an embodiment of the present disclosure.

FIG. 16 is a diagram illustrating a data processing system including a data storage device according to an embodiment of the present disclosure. Referring to FIG. 16, the data processing system 3000 may include a host device 3100 and a data storage device 3200.

The host device 3100 may be configured as a board such as a printed circuit board. Although not shown, the host device 3100 may include internal functional blocks for performing a function of the host device.

The host device 3100 may include a connection terminal 3110 such as a socket, a slot, or a connector. The data storage device 3200 may be mounted on the connection terminal 3110.

The data storage device 3200 may be configured as a board such as a printed circuit board. The data storage device 3200 may be referred to as a memory module or a memory card. The data storage device 3200 may include a controller 3210, a buffer memory device 3220, nonvolatile memories 3231 to 3232, a power management integrated circuit (PMIC) 3240, and a connection terminal 3250.

The controller 3210 may control an overall operation of the data storage device 3200. The controller 3210 may be configured identically to the controller 2210 shown in FIG. 14.

The buffer memory device 3220 may temporarily store data to be stored in the nonvolatile memories 3231 to 3232. In addition, the buffer memory device 3220 may temporarily store data read from the nonvolatile memories 3231 to 3232. The data temporarily stored in the buffer memory device 3220 may be transmitted to the host device 3100 or the nonvolatile memories 3231 to 3232 under control of the controller 3210.

The nonvolatile memories 3231 to 3232 may be used as a storage medium of the data storage device 3200.

The PMIC 3240 may provide power input through the connection terminal 3250 into the data storage device 3200. The PMIC 3240 may manage the power of the data storage device 3200 according to the control of the controller 3210.

The connection terminal 3250 may be connected to the connection terminal 3110 of the host device. Power and a signal such as a command, an address, and data may be transmitted between the host device 3100 and the data storage device 3200 through the connection terminal 3250. The connection terminal 3250 may be configured as various types according to an interface method between the host device 3100 and the data storage device 3200. The connection terminal 3250 may be disposed on any one side of the data storage device 3200.

Figure 17:
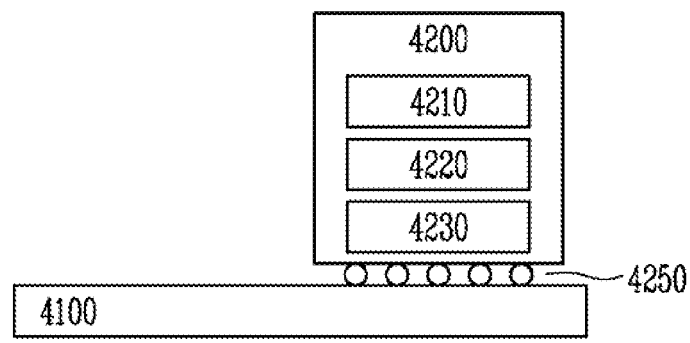
FIG. 17 is a diagram illustrating a data processing system including a data storage device according to an embodiment of the present disclosure.

FIG. 17 is a diagram illustrating a data processing system including a data storage device according to an embodiment of the present disclosure. Referring to FIG. 17, the data processing system 4000 may include a host device 4100 and a data storage device 4200.

The host device 4100 may be configured as a board such as a printed circuit board. Although not shown, the host device 4100 may include internal functional blocks for performing a function of the host device.

The data storage device 4200 may be configured as a surface mounted package. The data storage device 4200 may be mounted on the host device 4100 using solder balls 4250. The data storage device 4200 may include a controller 4210, a buffer memory device 4220, and a nonvolatile memory 4230.

The controller 4210 may control an overall operation of the data storage device 4200. The controller 4210 may be configured identically to the controller 2210 shown in FIG. 14.

The buffer memory device 4220 may temporarily store data to be stored in the nonvolatile memory 4230. In addition, the buffer memory device 4220 may temporarily store data read from the nonvolatile memories 4230. The data temporarily stored in the buffer memory device 4220 may be transmitted to the host device 4100 or the nonvolatile memory 4230 under control of the controller 4210.

The nonvolatile memory 4230 may be used as a storage medium of the data storage device 4200.

Figure 18:
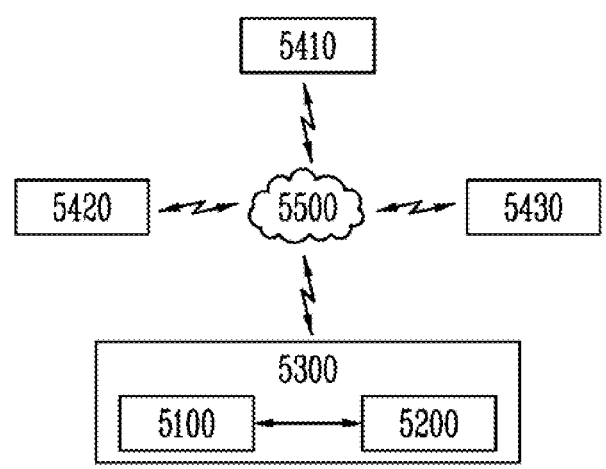
FIG. 18 is a diagram illustrating a network system including a data storage device according to an embodiment of the present disclosure.

FIG. 18 is a diagram illustrating a network system including a data storage device according to an embodiment of the present disclosure. Referring to FIG. 18, the network system 5000 may include a server system 5300 and a plurality of client systems 5410 to 5430 connected through a network 5500.

The server system 5300 may service data in response to a request of the plurality of client systems 5410 to 5430. For example, the server system 5300 may store data provided from the plurality of client systems 5410 to 5430. As another example, the server system 5300 may provide data to the plurality of client systems 5410 to 5430.

The server system 5300 may include a host device 5100 and a data storage device 5200. The data storage device 5200 may include the memory device 100 of FIG. 1, the SSD 2200 of FIG. 14, the data storage device 3200 of FIG. 16, and the data storage device 4200 of FIG. 17.

Since the present disclosure may be implemented in other specific forms without changing the technical spirit or essential features thereof, those of ordinary skill in the art to which the present disclosure pertains should understand that the embodiments described above are illustrative and are not limited in any respect. The scope of the present disclosure is indicated by the claims to be described later rather than the detailed description, and all changes or modifications derived from the meaning and scope of the claims and their equivalent concepts are interpreted as being included in the scope of the present disclosure.

What is claimed is:

1. A memory device comprising:
   a memory block including memory cells to which a program voltage is applied through a word line;
   a peripheral circuit configured to perform a verify operation of comparing threshold voltages of the memory cells with a verify voltage on each of a plurality of program levels; and
   a control logic circuit configured to control the peripheral circuit to apply a plurality of blind voltages related to a target level among the plurality of program levels to the word line, and determine a start time point of a verify operation corresponding to a next program level of the target level using a number of fail bits for each of the plurality of blind voltages.

2. The memory device of claim 1, wherein the plurality of blind voltages includes a verify voltage of the target level, a read voltage of the target level, a double verify voltage of the next program level of the target level, or a verify voltage of the next program level of the target level.

3. The memory device of claim 2, wherein the control logic circuit comprises a reference value manager capable of applying at least two of the plurality of blind voltages to the word line and determining a reference value for the number of fail bits.

4. The memory device of claim 3, wherein the reference value manager is capable of determining the reference value based on the number of fail bits stored in a lookup table according to a pre-program pulse.

5. The memory device of claim 3, wherein the control logic circuit comprises a verify manager capable of determining a target voltage having the number of fail bits closest to the reference value among the plurality of blind voltages.

6. The memory device of claim 5, wherein the verify manager is capable of determining the start time point of the verify operation corresponding to the next program level of the target level based on the number of fail bits for the target voltage.

7. The memory device of claim 5, wherein the verify manager is capable of determining an end time point of a verify operation corresponding to the target level based on the number of fail bits for the target voltage.

8. The memory device of claim 5, wherein the control logic circuit comprises storage configured to store information on at least one of the number of fail bits for each of the plurality of blind voltages, the reference value, and the target voltage.

9. A memory device comprising:
   a memory block including memory cells to which a program voltage is applied through a word line;
   a peripheral circuit configured to perform a verify operation of comparing threshold voltages of the memory cells with a verify voltage on each of a plurality of program levels; and
   a control logic circuit configured to control the peripheral circuit to apply a plurality of blind voltages related to a first level among the plurality of program levels to the word line in a voltage magnitude order, and determine a start time point of a verify operation corresponding to a second level that is a next program level of the first level using a number of fail bits for each of the plurality of blind voltages.

10. The memory device of claim 9, wherein the plurality of blind voltages includes a verify voltage of the first level, a read voltage of the first level, a double verify voltage of the second level, or a verify voltage of the second level.

11. The memory device of claim 10, wherein the control logic circuit comprises a reference value manager capable of applying a reference value for the number of fail bits based on the number of fail bits stored in a lookup table according to a pre-program pulse.

12. The memory device of claim 11, wherein the control logic circuit comprises a verify manager capable of applying the plurality of blind voltages related to the first level in the voltage magnitude order until a target voltage having the number of fail bits greater than or equal to the reference value is applied to the word line, and determining the start time point of the verify operation corresponding to the second level based on the number of fail bits for the target voltage.

13. The memory device of claim 12, wherein the verify manager is capable of determining an end time point of a verify operation corresponding to the first level based on the number of fail bits for the target voltage.

14. The memory device of claim 12, wherein the control logic circuit comprises storage configured to store information on at least one of the number of fail bits for each of the plurality of blind voltages, the reference value, and the target voltage.

15. A method of operating a memory device, the method comprising:
   applying a program voltage to memory cells through a word line; and
   performing a verify operation of comparing threshold voltages of the memory cells with a verify voltage on each of a plurality of program levels, wherein performing the verify operation comprises:
   applying a plurality of blind voltages related to a target level among the plurality of program levels to the word line; and
   determining a start time point of a verify operation corresponding to a next program level of the target level using a number of fail bits for each of the plurality of blind voltages.

16. The method of claim 15, wherein applying the plurality of blind voltages to the word line comprises:
   applying at least two of a verify voltage of the target level, a read voltage of the target level, a double verify voltage of the next program level of the target level, and a verify voltage of the next program level of the target level to the word line; and
   determining a reference value for the number of fail bits.

17. The method of claim 16, wherein determining the start time point of the verify operation corresponding to the next program level of the target level comprises:
   determining a target voltage having the number of fail bits closest to the reference value among the plurality of blind voltages; and
   determining the start time point of the verify operation corresponding to the next program level of the target level based on the number of fail bits for the target voltage.

18. The method of claim 17, further comprising:
   determining an end time point of a verify operation corresponding to the target level based on the number of fail bits for the target voltage.

19. A method of operating a memory device, the method comprising:
   applying a program voltage to memory cells through a word line; and
   performing a verify operation of comparing threshold voltages of the memory cells with a verify voltage on each of a plurality of program levels, wherein performing the verify operation comprises:
applying a plurality of blind voltages related to a first level among the plurality of program levels to the word line in a voltage magnitude order; and
determining a start time point of a verify operation corresponding to a second level that is a next program level of the first level using a number of fail bits for each of the plurality of blind voltages.

20. The method of claim 19, wherein performing the verify operation comprises:
determining a reference value based on the number of fail bits stored in a lookup table according to a pre-program pulse;
applying the plurality of blind voltages related to the first level in the voltage magnitude order until a target voltage having the number of fail bits greater than or equal to the reference value is applied to the word line; and
determining a start time point of the verify operation corresponding to the second level based on the number of fail bits for the target voltage.

\* \* \* \* \*